United States Patent [19]
Bruce et al.

[11] Patent Number: 5,418,003
[45] Date of Patent: May 23, 1995

[54] VAPOR DEPOSITION OF CERAMIC MATERIALS

[75] Inventors: Robert W. Bruce, Loveland, Ohio; David W. Skelly, Burnt Hills, N.Y.; William P. Minnear, Schenectady, N.Y.; Richard A. Nardi, Jr., Scotia, N.Y.; David J. Wortman, Hamilton, Ohio; Antonio F. Maricocchi, Loveland, Ohio; Rudolfo Viguie, Cincinnati, Ohio; David V. Rigney, Cincinnati, Ohio

[73] Assignee: General Electric Company, Cincinnati, Ohio

[21] Appl. No.: 120,009

[22] Filed: Sep. 10, 1993

[51] Int. Cl.⁶ .................... C23C 14/24; B05D 3/06
[52] U.S. Cl. .................... 427/126.2; 427/126.3; 427/126.1; 427/566
[58] Field of Search .............. 427/126.2, 126.3, 126.1, 427/566

[56] References Cited

U.S. PATENT DOCUMENTS

| | | | |
|---|---|---|---|
| 4,379,832 | 4/1983 | Dalal et al. | 430/315 |
| 4,838,935 | 6/1989 | Dunlop et al. | 75/230 |
| 4,938,798 | 7/1990 | Chiba et al. | 75/230 |
| 5,055,246 | 10/1991 | Jalby et al. | 264/81 |

OTHER PUBLICATIONS

"Encyclopedia of Chemical Technology" by Kirk-Othmer, third edition, vol. 20 pp. 42 and 43 (1982).
"Thin Film Microelectronics" edited by L. Holland, pp. 114 and 189 (1969).

Primary Examiner—Roy V. King
Attorney, Agent, or Firm—Jerome C. Squillaro; David L. Narciso

[57] ABSTRACT

Evaporated ceramic coatings are prepared by furnishing an ingot of a ceramic material, treating the ingot to reduce sources of gas within the ingot, and evaporating the ceramic material in the ingot by melting the surface of the ingot with an intense heat source. The evaporated ceramic is deposited upon a substrate as the ceramic coating. The reduced gas content of the ingot decreases the incidence of spitting and eruptions from the molten surface of the ingot, thereby improving the quality of the deposited coating, and facilitating increases in evaporation rates and coatings process production rates.

18 Claims, 2 Drawing Sheets

VAPOR DEPOSITION OF CERAMIC MATERIALS

BACKGROUND OF THE INVENTION

This invention relates to the vapor deposition of ceramic materials, and, more particularly, to improving the quality of vapor-deposited ceramic coatings by improving the feedstock used in the vapor deposition process.

Ceramic coatings are used to protect and insulate substrates in a number of applications. Ceramics usually exhibit low thermal and electrical conductivities, as well as high melting points. Most are stable at elevated temperatures. Many ceramics are resistant to oxidation, corrosion, or other forms of degradation to which metals are usually more prone. Unfortunately, most ceramics have low ductility that limit their usefulness as structural materials, although much research is devoted toward remedies for this shortcoming. In the meantime, however, the ceramics find an important use as protective coatings for underlying metallic substrates.

For example, in some advanced aircraft engines the superalloy turbine blades and vanes are coated with a thin ceramic thermal barrier coating. The thermal barrier coating acts as an insulator so that the turbine components can operate at gas-path temperatures higher than would otherwise be possible. It also protects the substrate against mechanical damage such as erosion, nicks, and dings from the impact of foreign objects ingested by the engine, referred to as foreign object damage (FOD). The thermal barrier coating may be used in conjunction with other layers deposited upon the metallic substrate, such as a bond coat, that inhibit oxidation and corrosion. The resulting thermal barrier coating system deposited upon the metallic turbine component enhances its performance by permitting it to operate at higher gas temperatures than otherwise possible and also prolongs its operating life.

The deposition of a thin ceramic coating onto a metallic substrate is itself a technically challenging operation. Since the coating is thin, it must be highly uniform. Even small nonuniformities can bridge through the entire thickness of the coating or cause such defects in the coating that it becomes vulnerable to premature failure.

One of the most popular techniques used to deposit a thin ceramic coating is physical vapor deposition (PVD). In one PVD process, the top end of an ingot of the ceramic material to be deposited is placed in a chamber which is then evacuated. The chamber can accommodate small ingots having a weight of about five (5) pounds. The typical size of an ingot is about 8" in length and 2.5" in diameter. The ingot then is heated by an intense beam of electrons or other heating source such as a laser. The heated end of the ingot is melted to form a molten pool. The heating of the surface of the molten pool is so intense that molecules of the ceramic evaporate from the melted surface. The object to be coated is positioned above the molten pool, and the evaporated molecules deposit upon the object to gradually build up a coating. A translation mechanism moves the ingot slowly upwardly to replace the evaporated material of the molten pool with additional ceramic, permitting the deposition to be performed in a continuous manner. Equivalently, pellets of the material to be evaporated having a size of about 0.125" to about 1" in diameter, instead of ingots, may be supplied and continuously fed to the vaporization apparatus.

When coatings produced by conventional electron beam physical vapor deposition (EB-PVD) apparatus are examined closely, there are often observed a large number of small chunks or pieces o,f inhomogeneous ceramic material embedded in the otherwise-homogeneous ceramic coating. These chunks of inhomogeneous ceramic material can separate from the coating during service of the coated article, leaving pinholes through the ceramic coating. The pinholes permit the hot gas to penetrate to the underlying bond coat and metallic substrate, quickly burning and/or corroding it and causing failure of the turbine component.

Efforts to reduce this problem have heretofore centered on improving the heating pattern of the molten pool. In EB-PVD, for example, an intense electron beam is repeatedly passed over the surface of the molten pool in a preselected pattern. It has been found that altering the beam intensity and heating pattern has yielded some improvement in coating uniformity. Nevertheless, even with optimization of the heating of the molten pool, inhomogeneities in the applied ceramic coating remain a problem. These inhomogeneities are caused by instabilities in the process which manifest themselves as spits, which is an ejection of a particle from the molten pool. A multitude of such ejections is called an eruption. Both events lead undesirable macroparticles being incorporated into the coating.

There is a need for an approach to understanding the origin of the inhomogeneities in the ceramic coatings and avoiding, or at least minimizing, the incidence of these features. The present invention fulfills this need, and further provides related advantages.

SUMMARY OF THE INVENTION

The present invention provides an approach to depositing ceramic coatings and improving the quality of the coated articles. Inhomogeneities in the coatings are reduced or eliminated, without adversely affecting coating and production rates. The approach of the invention is consistent with the use of conventional physical vapor deposition apparatus or advanced variations of such apparatus.

In accordance with the invention, a method for depositing improved evaporated ceramic coatings having reduced inhomogeneities comprises the steps of furnishing an ingot of a ceramic material, treating the ingot to reduce sources of gas within the ingot, and evaporating the ceramic material in the ingot by melting the surface of the ingot with an intense heat source in a physical vapor deposition apparatus and depositing the evaporated material upon a substrate as a coating.

A key to the present invention is the discovery and understanding of the sources of the inhomogeneities in the ceramic coatings. Photographic studies have demonstrated that the inhomogeneities arise from the formation and evolution of gas bubbles from the surface of the molten pool from which the ceramic is evaporated. The larger bubbles often emanate from cracks in the solid ingot under the molten pool, indicating that the mechanical integrity of the ingot is an important factor in bubble formation.

When these gas bubbles rise through the molten pool and evolve from the surface of the molten pool, the smooth surface of the pool is momentarily disrupted as the gas bubble leaves the surface, The surface then collapses back toward its original flat shape. During that transient event, a mass of the ceramic material can be ejected from the surface of the molten pool to be deposited as a mass on the article to be coated. A single such mass is termed a "spit", while a plurality of such ejection or "spitting" events in rapid succession resulting in a nearly continuous ejection of the deposited ceramic material by this mechanism is termed an "eruption". The gas released into the coating chamber by the bubble ejection causes a temporary imbalance of the gas pressure in the coating chamber and alters the focus of the electron beam. Both of these effects are undesirable interruptions to the regular evaporation process that can lead to inhomogeneities.

The incidence of spits and eruptions can be decreased by reducing the evolution of gas bubbles from the surface of the molten pool. The evolution of gas bubbles can, in turn, be decreased by reducing the sources of gas in the ceramic ingot. As used herein, the concept of decreasing the sources of gas in the ingot includes reducing "equivalent" gas sources, both entrapped free gas and also components that react to produce gas.

The amount of free gas in the ceramic ingot can be reduced by decreasing the amount of porosity and cracks in the ingot. The lower the porosity and cracking (equivalently, the higher the relative density) of the ceramic ingot, the smaller the amount of gas contained in the ingot at the time it melts into the molten pool. Paradoxically, the amount of free gas can also be reduced by increasing the porosity, as long as the increased porosity is an open-cell or connected porosity such that any entrapped gas can be evacuated from the porosity by heating and/or a vacuum treatment before the ingot reaches a molten state. Production of large bubbles can also be reduced or avoided by improving the integrity and strength of the solid ingot so that it resists cracking under the high thermal gradients present just below the molten pool. It appears that gaseous products accumulate aside such cracks. From this perspective a crack-resistant material is desirable.

There are a number of chemical elements or compounds that can produce gas in the ingot during the melting operation. One is water adsorbed in the porosity of the ceramic ingot, or into cracks and other imperfections in the ceramic ingot. Another is chemically bonded water of hydration, as commonly found in oxides. The incidence of spits and eruptions can be substantially reduced by heating the ceramic ingot to a sufficiently high temperature in vacuum such that substantially all of the water vapor is removed from the ingot. Inasmuch as the purpose of the heat treatment is to remove entrapped compounds or elements by diffusional processes, the absolute physical dimensions of the ingot being treated can be important. The ingot diameter and ratio of ingot length to diameter has been found to be relevant to the removal of gas sources from the ingot during heat treatment.

It was found that, if the ceramic ingot is allowed to re-absorb water vapor after its removal, as by sitting in an ambient (water vapor containing) atmosphere for a period of time before use, the problem of spits and eruptions can return. Thus, after the heat treatment, the ingot must be protected against re-introduction of the gas source prior to use. One approach is to bag the treated ingot in a hermetically sealed container or to store the treated ingot in a vacuum until it is to be used. Reabsorption of gas can also be retarded by backfilling the vacuum chamber at the end of the vacuum heat treatment in which the water vapor is removed, with oxygen, argon, or other dry or inert gas.

Another source of gas is elemental impurities in the ingot that can chemically react to produce gaseous compounds or compounds that vaporize at relatively low temperature. Source elemental impurities include carbon, sodium, potassium, iron, aluminum, chromium, niobium, tantalum and silicon, all of which can produce volatile oxides, and all of which are present as impurities in ceramic material such as yttria-stabilized zirconia, and phosphorus:, which can react to produce phosphine or other phosphorus-containing compounds.

In one embodiment of the present invention, a method for depositing evaporated ceramic coatings comprises the steps of providing an ingot of a ceramic material having a gas-equivalent content of available gas-evolving sources, such as gas forming impurity elements, of less than about 0.05% by weight, and evaporating the ceramic material in the ingot by melting the surface of the ingot with an intense heat source and depositing the evaporated material upon a substrate as a coating.

The present invention thus provides an important improvement to the deposition of ceramic materials by physical vapor deposition processes. The incidence of defects in the ceramic coatings is reduced or eliminated by decreasing the gas content of the feedstock ceramic ingot that is melted and evaporated in the process. The reduction of the number of spitting and eruption events leads to a more stable process which facilitates an increase in evaporation rate and; coating process production rate. It also makes the process significantly more stable and reduces the need for operator interference in the process, thus leading to productivity improvements. An additional advantage is that the reduced amount of debris from eruptions at the edge of the crucible improves efficiency and process controllability. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENTS

Figure 1:
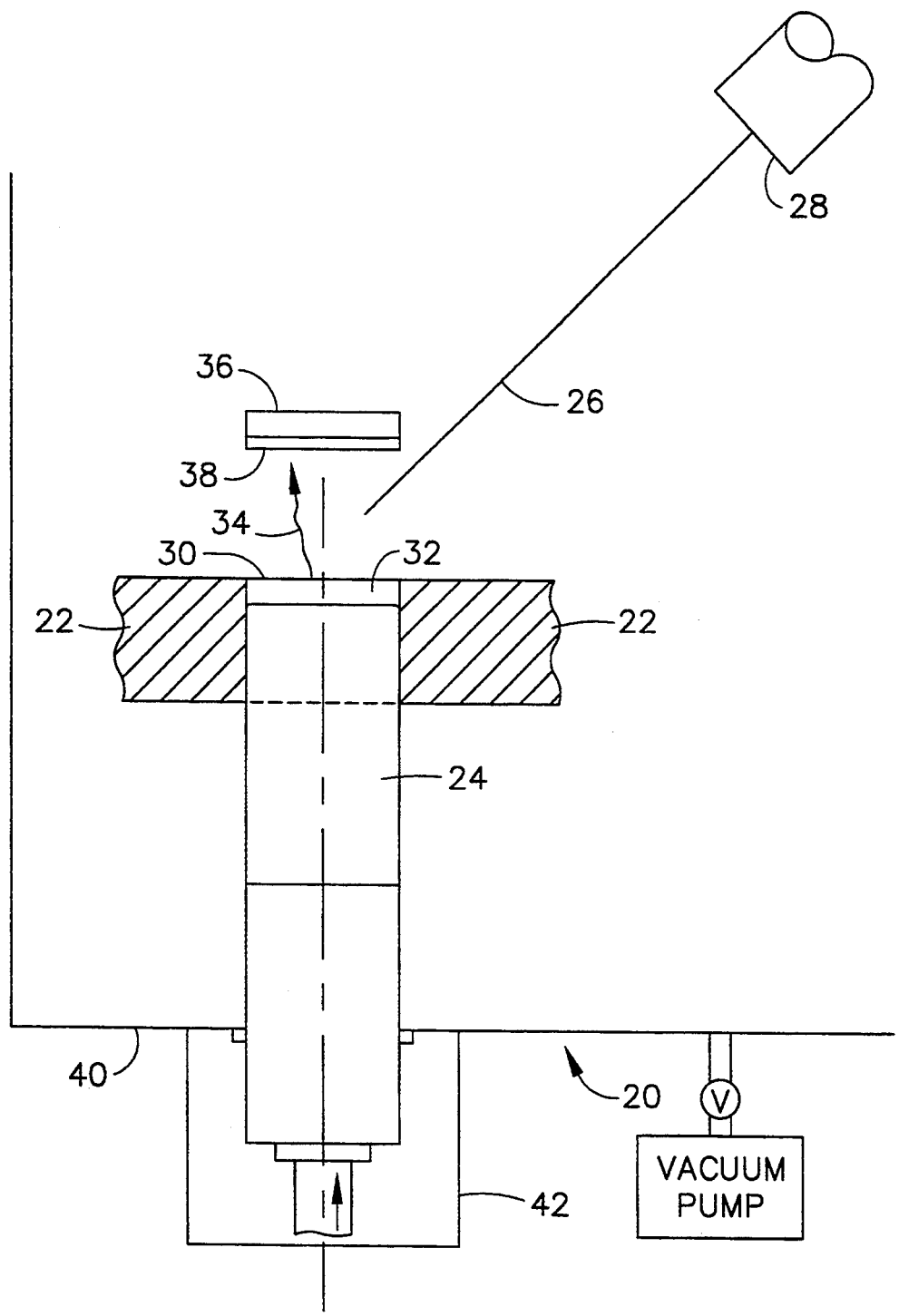
FIG. 1 is a schematic elevational view of an electron beam physical vapor deposition apparatus.

FIG. 1 illustrates an electron beam physical vapor deposition (EB PVD) apparatus 20 with which the present invention may be used. Such apparatus is well known, and is available commercially. The apparatus 20 includes a crucible 22 in the form of a collar having sides and an open bottom.

An ingot 24 of a ceramic material is inserted vertically upwardly into the bottom of the crucible. An electron beam 26 produced by an electron beam gun 28 is directed against an upper end 30 of the ingot 24. The energy of the electron beam 26 heats the upper end 30 of the ingot. The heating, when sufficiently intense, causes the ceramic at that location to melt, forming a molten pool 32. Ceramic material from the molten pool evaporates upwardly as an evaporated stream 34. The stream 34 strikes a substrate 36, causing ceramic material from the stream 34 to condense at the relatively cool substrate/bond coat surface and to deposit as a ceramic coating 38. In the case of most interest to the inventors, the substrate 36 can be a metallic turbine component, or such a component that is coated with a bond coat layer.

The above described components are located within a vacuum chamber 40, which is typically pumped to a vacuum of about 0.005 millibar during the evaporation operation. The ingot 24 is introduced into the vacuum chamber through an airlock 42. Substrates can also be introduced through a separate airlock, if desired, to make the process continuous.

Figure 2:
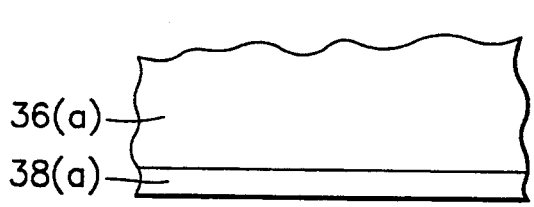
FIGS. 2 and 3 are details of FIG. 1, showing the surface of the substrate, with FIG. 2 depicting the desired state and FIG. 3 depicting the result of spits of ceramic formed during deposition.
Figure 3:
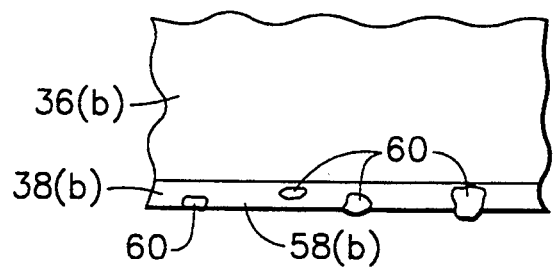
Figure 4:
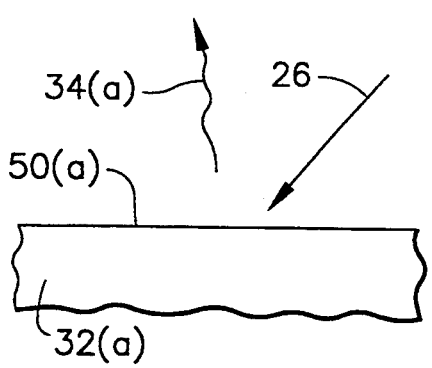
FIGS. 4 and 5 are details of FIG. 1, showing events at the surface of the molten pool, with FIG. 4 depicting the desired state and FIG. 5 depicting the result of gas bubbles in the molten ceramic.
Figure 5:
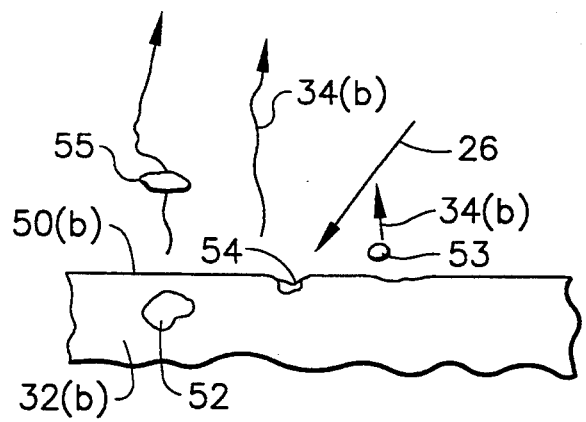

FIGS. 2, 3, 4 and 5 together illustrate the desired coating and how it is produced (FIGS. 2 and 4) and the undesirable coating with spits (FIGS. 3 and 5). Referring to FIGS. 2 and 4, in the desired state the electron beam 26 is directed against a smooth, generally flat upper surface $50(a)$ of the molten pool $32(a)$. The evaporated stream $34(a)$ is uniform. Consequently, the coating $38(a)$ on the substrate $36(a)$ shown in FIG. 2A is uniform.

Referring to FIGS. 3 and 5, there may sometimes be gas bubbles 52 in the melted ceramic of the molten pool $32(b)$. The gas bubbles 52 float upwardly in the molten ceramic, eventually reaching the surface $50(b)$. Internal gas pressure increases the size of the bubble. Eventually, the surface tension of the bubble cannot retain its shape and integrity, so that it bursts to create a spitting or eruption event. Because of the rapid expansion of the bubble as it bursts, the material that formed the wall of the bubble is flung outwardly as distinct particles 53.

In another mechanism, smaller bubbles reaching the surface of the pool may break, forming a small depression 54 in the surface $50(b)$. As surface tension of the liquid and gravity close the depression 54, a molten mass 55 of ceramic can be ejected from the surface $52(b)$. The molten mass 55 becomes part of the evaporated stream $34(b)$ and impacts against the substrate $36(b)$. In some instances, the molten mass 55 may solidify entirely or in part as it travels from the molten pool $32(b)$ to the substrate $36(b)$, and in other instances it may remain molten as it travels.

As shown in FIGS. 3 and 5, the result is a coating $38(b)$ that has local uniform, homogeneous regions $58(b)$ as a result of evaporation from the uniform portion of the surface $50(b)$ of the molten pool $32(b)$. Embedded in or in between the uniform regions are the solidified remains of the particles 53 and masses 55, termed "spits" 60. Some spits 60 may be so small that they are found through only a portion of the thickness of the coating $38(b)$, while others may be so large that they penetrate through the entire thickness of the coating $38(b)$. In either event, the spits 60 disrupt the continuity of the coating $38(b)$. Testing has demonstrated that, during subsequent service, the entire spit 60 may dislodge from the coating $38(b)$ and fall out. There results a pinhole through all or a part of the thickness of the coating $38(b)$. Hot exhaust gases can penetrate these pinholes, leading to burning and rapid failure of the substrate $36(b)$. Where the substrate 36 is an active component of a jet engine, such as a turbine blade or vane, the result can be a failure of the component and damage to the engine.

The inventors have performed high speed, high magnification photographic studies to determine the relation between events at the surface of the molten pool, FIGS. 4 and 5, and the structure of the coating, FIG. 2 and 3. These studies verify that the origin of at least a portion of the spits found in the coating can be traced to the evaporative process.

To reduce the incidence of the spits 60 in the coating 38, the amount of equivalent gas sources that can produce the bubbles 52 are reduced according to the present invention. By "equivalent gas sources" is meant gas bubbles and gas trapped within the ingot 24, and also elements and compounds that can produce gas or vapor within the ingot 24 and/or the molten pool 32. Thus, any source that can produce gas bubbles in the molten pool should be reduced.

Figure 6:
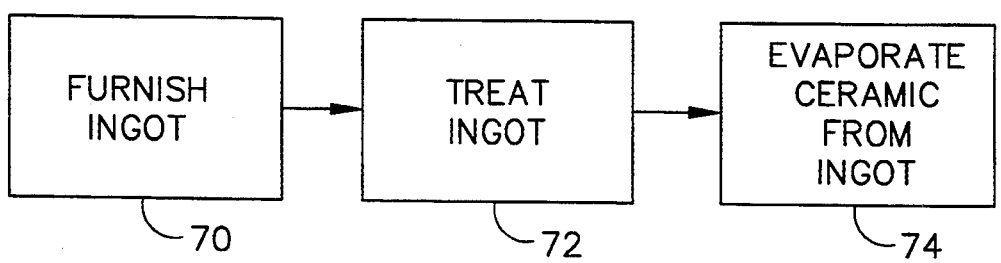
FIG. 6 is a block flow diagram for the process of the invention.

FIG. 6 shows the general approach for practicing the invention. An ingot 24 of ceramic is furnished, numeral 70. The ingot is normally fabricated by sintering powders of the ceramic composition to be evaporated in the apparatus 20. Sintering normally leaves some porosity in the structure, which can entrap gas. Sintering can also adversely affect the mechanical properties of the ingot, reducing its strength. The manufacturing process also may leave impurity elements in the ceramic ingot 24. Some of the impurity elements may react to produce gas and vapor in the molten pool. According to specific implementations of the invention to be discussed subsequently, the amount of these sources of gas and vapor is reduced.

The fabricated ingot can be further treated, numeral 72, to reduce the equivalent sources of gas. These treatments remove equivalent sources of gas from the fabricated ingot. Significantly, it is found that the timing of the treatment 72 can affect the performance of the ingot in the evaporation process, for at least some of the sources of gas. For example, water vapor entrapped in the porosity of the ceramic ingot has been determined to be a major source of gas bubbles 52 that can disrupt the evaporation process. If the water entrapped in the structure is removed, but water vapor allowed to reinfiltrate the ingot before use, the heat treatment has no beneficial effect. The ingot must be protected against re-introduction of the water vapor prior to use, if that use occurs any significant time after the heat treatment.

After the treatment 72, the ingot 24 is used in an evaporation process like that described in relation to FIG. 6, numeral 74.

A parameter of the ingot 24 of significance to the present invention is its relative density, where relative density is the percentage of full density realized by the sintered ingot structure. Conventional ceramic of yttria-stabilized zirconia, the ceramic of most interest to the present invention, generally has a relative density of about 60 percent or less. Such an ingot density results in spits in the deposited coating.

The relative density of the ingot can be raised to reduce the gas concentration in the ingot and thence spitting during evaporation. The relative density is preferably raised to at least about 3.6 grams per milliliter. (The maximum theoretical density of yttria-stabilized zirconia is about 5.9–6.1 grams per milliliter) When the relative density of the ingot is increased by greater densification during fabrication of the ingot, the amount of porosity is decreased. The gas trapped within the ingot is also decreased, reducing the incidence of spitting.

The incidence of spitting can also be reduced by ensuring that the porosity in the ingot is continuously interconnected, even though the density remains the same. Such continuously interconnected porosity is referred to as "open cell" porosity. Such an ingot is outgassed by heating it to a temperature of at least about 1000° C. in vacuum, so that the gas can be drawn out of the ingot.

The gas evolution during melting and evaporating of the ceramic can be reduced by eliminating gas-forming sources during the manufacture of the ingot or thereafter during post-fabrication heat treatments. Gas forming constituents can be of two types, those that are present in solid or liquid form in the ingot and then vaporize when heated, and those that react with other constituents of the ingot to produce a gas.

The most important of the first type of gas sources is water, which can be trapped within the porosity of the ingot during fabrication, or can be drawn into the interior porosity of the ingot between the time of fabrication and the time of melting. To remove water from the ingot, the ingot is heated to a temperature sufficient to vaporize the water and cause it to diffuse out of the interior of the ingot. The heating is preferably accomplished in a vacuum, to assist in removing the water vapor from the interior of the ingot.

If the ingot is heated to a relatively low temperature, the water may vaporize but it cannot diffuse from the interior of the ingot to the surface and away to the vacuum system. For example, it has been found that heating to a temperature of about 400° C. is not sufficient to remove the water vapor, even though that temperature is well above the boiling point of water. Instead, vacuum heat treatments of 750° C. and 1000° C. for yttria-stabilized zirconia have been found effective in driving the water vapor from the interior of the ingot. On the other hand, heating to too-high a temperature can in some cases cause damage to the ingot material. Heating yttria-stabilized zirconia to a temperature of 1500° C. causes a chromium/aluminum spinel to form on the surface of the ingot due to impurities in the ingot material, which may interfere with the subsequent evaporation behavior of the ingot. Thus, a heat treatment temperature of from about 750° C. to about 1400° C. is preferred for this material.

The removal of water vapor and other volatiles from the interior of the ingot is aided by maintaining the ingot diameter relatively small, and also by maintaining the ratio of the length to the diameter of the ingot relatively small. A small diameter and relatively short length aid in outgassing the interior portions of the ingot by reducing the diffusion lengths to the free surface of the ingot. A length to diameter ratio of about 4:1 is desirable to permit efficient removal of the water vapor trapped in the interior of the ingot during heat treatment. With this ratio, outgassing can occur in both the radial and axial direction. At higher ratios, outgassing in the axial direction is impeded by the increased distance to the surface, thereby reducing the effectiveness of the outgassing procedure.

When a volatile material such as water that is present in the environment has been driven from the interior of the ingot, it may be reintroduced into the ingot if the ingot contacts water after the heat treatment and before its use in vaporization. Contact with either liquid water or even the water vapor in the air may be sufficient to cause reintroduction of water into the ingot. To avoid such reintroduction, it is preferred to protect the ingot after fabrication and/or heat treatment by placing in within a hermetically sealed container and providing desiccants to dry any water that may be present. After the heat treatment to remove water the ingot may be saturated with a dry gas to reduce the rate of reabsorption of water vapor.

The other source of substances that can react to produce gas in the interior of the ingot or the molten pool is constituents that can react with other constituents to produce a gas. For example, carbon will react with the oxygen in the ceramic in the air or in the coating apparatus atmosphere to produce an oxide gas. Phosphorus can react with copper or hydrogen to produce a phosphide or phosphine gas. These products are all gaseous at the temperature of the molten pool; and therefore can produce bubbles in the molten pool. Other chemical reactions may also occur at the elevated temperatures which may also produce undesirable gases. It is therefore desirable to reduce the contents of these gas-forming elements to a sufficiently low level that substantially no spiring results from their presence. It is emphasized that relatively small amounts of these elements are not deleterious to the coating properties if incorporated into the coating. Their content is reduced to aid in achieving uniform, controlled evaporation from the molten pool.

To this end, it has been found that the carbon, aluminum, phosphorus, iron, silicon, chlorine and titanium are preferably below certain amounts in the ingot. More specifically, the preferable amount of each of these elements, in parts per million(ppm), is C—500 ppm or less, Al—100 ppm or less, P—300 ppm or less, Fe—1000 ppm or less, Si—500 ppm or less, Cl—500 ppm or less and Ti—1000 ppm or less. To manufacture ingots having such low levels of these elements, it is necessary to begin with starting materials in powder form of the highest possible quality. With the exception of a heat treatment to reduce carbon content, no post-manufacture processing to remove these elements is normally required, when the starting ingot is of high purity. Hermetic sealing of the ingot after heat treatment prevents reintroduction of water vapor and other undesirable gases, even if present in the environment. Alternatively, after a vacuum heat treatment, the ingot may be saturated with an inert gas to reduce the rate of reabsorption of water vapor and other gases.

A number of ingots of yttria-stabilized zirconia were manufactured in which the amounts of the critical elements C, Al, P, Si, and Ti were present in varying amounts. The amounts of each of these elements was determined before the ingot was inserted into the PVD chamber. Each ingot was suitably degassed prior to application of the electron beam to the ingot. The number of spits and eruptions was observed and converted into a misery index. The misery index is defined as the number of spitting events plus three times the number of eruptions per millimeter of ingot. The data is presented in Table I

TABLE I

| Test | C | Al | P | Si | Ti | Y* | Misery Index |
|---|---|---|---|---|---|---|---|
| 1 | 140 | 52 | 40 | 45 | 510 | 5.12 | 0.69 |
| 2 | 310 | 37 | 240 | 160 | 780 | 5.91 | 0.83 |
| 3 | 210 | 64 | 66 | 68 | 510 | 5.12 | 1.06 |
| 4 | 460 | 220 | 330 | 280 | 920 | 5.12 | 2.31 |

TABLE I-continued

| Test | C | Al | P | Si | Ti | Y* | Misery Index |
|---|---|---|---|---|---|---|---|
| 5 | 11000 | 780 | 440 | 250 | 840 | 5.12 | 2.90 |

All values in PPM unless otherwise indicated
*Weight percent

A misery index above about 1.5 is considered unacceptable. As the data indicates, the number of eruptions and/or spits increases as the amounts of these elements increases.

Although a particular embodiment of the invention has been described in detail for purposes of illustration, various modifications may be made without departing from the spirit and scope of the invention. Accordingly, the invention is not to be limited except as by the appended claims.

What is claimed is:

1. A method for depositing evaporated ceramic coatings, comprising the steps of:
   furnishing an ingot of a ceramic material, the ingot having porosity therein;
   next, treating the ingot to reduce sources of gas trapped within the porosity of the ingot; followed by
   evaporating the ceramic material in the previously treated ingot by melting the surface of the ingot with an intense heat source; and
   depositing the evaporated material upon a substrate as a coating.

2. The method of claim 1, wherein the step of treating is accomplished by heating the ingot to a temperature at which substantially all entrapped gas is evolved from the ingot before the step of evaporating.

3. The method of claim 2, wherein the step of heating the ingot is performed in a vacuum.

4. The method of claim 2, wherein the temperature to which the ingot is heated during the step of heating is at least about 750° C. (1382° F.) but less than about 1400° C. (2552° F.) in a vacuum.

5. The method of claim 1 further including the step of protecting the ingot against reintroduction of gas prior to the evaporating step and after the treating step by sealing the ingot in a vacuum sealed container.

6. The method of claim 1 wherein the step of treating to remove gases includes treating to remove water vapor.

7. The method of claim 6 further including the step of protecting the ingot against reintroduction of water vapor prior to the evaporating step and after the heating step by sealing the ingot in a hermetically sealed container backfilled with a gas selected from the group consisting of oxygen and inert gases.

8. The method of claim 1, wherein the step of furnishing an ingot includes providing an ingot having a length and a diameter, and the length is from about one to about four times the diameter.

9. The method of claim 1, wherein the step of furnishing an ingot includes furnishing a modified zirconium oxide.

10. A method for depositing evaporated ceramic coatings, comprising the steps of, in sequence:
    furnishing an ingot of a porous yttria-stabilized zirconia ceramic material having a density of less than 3.6 grams per milliliter;
    treating the ingot to increase the density of the ingot to at least 3.6 grams per milliliter;
    evaporating the ceramic material in the ingot by melting the surface of the ingot with an intense heat source; and
    depositing the evaporated material upon a substrate as a coating.

11. A method for depositing evaporated ceramic coatings, comprising the steps of, in sequence:
    furnishing an ingot of a ceramic material having a chemical composition of a gas-forming impurity element and oxides thereof sufficiently low that a negligible amount of gas is evolved during surface melting of the ingot, the gas-forming impurity element including at least one element selected from the group consisting of carbon, aluminum, silicon, phosphorus, iron, chlorine, and titanium, and wherein the total weight of the gas forming impurity elements is no greater than 0.05% by weight;
    evaporating the ceramic material in the ingot by melting the surface of the ingot with an intense heat source; and
    depositing the evaporated material upon a substrate as a coating.

12. The method of claim 11, wherein the gas forming impurity element is carbon present in the amount of 500 ppm or less.

13. The method of claim 11, wherein the gas forming impurity element is aluminum present in the amount of 100 ppm or less.

14. The method of claim 11, wherein the gas forming impurity element is phosphorus present in the amount of 300 ppm or less.

15. The method of claim 11, wherein the gas forming impurity element is iron present in the amount of 1000 ppm or less.

16. The method of claim 11, wherein the gas forming impurity element is silicon present in the amount of 500 ppm or less.

17. The method of claim 11, wherein the gas forming impurity element is chlorine present in the amount of 500 ppm or less.

18. The method of claim 11 wherein the gas forming impurity element is titanium present in the amount of 1000 ppm or less.

* * * * *